(12) United States Patent
Lu et al.

(10) Patent No.: US 9,411,521 B2
(45) Date of Patent: Aug. 9, 2016

(54) METHOD AND APPARATUS FOR IMPROVING SEQUENTIAL MEMORY READ PREFORMANCE

(71) Applicant: MACRONIX INTERNATIONAL CO., LTD., Hsinchu (TW)

(72) Inventors: Hsing-Chen Lu, Hsinchu (TW); Pochao Fang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 91 days.

(21) Appl. No.: 14/291,998

(22) Filed: May 30, 2014

(65) Prior Publication Data

US 2015/0347027 A1    Dec. 3, 2015

(51) Int. Cl.
*G11C 8/04* (2006.01)
*G06F 3/06* (2006.01)
*G11C 8/18* (2006.01)
*G06F 12/02* (2006.01)

(52) U.S. Cl.
CPC ............ *G06F 3/0611* (2013.01); *G06F 3/0659* (2013.01); *G06F 3/0679* (2013.01); *G11C 8/04* (2013.01); *G06F 12/0246* (2013.01); *G11C 8/18* (2013.01)

(58) Field of Classification Search
CPC ............ G11C 8/04; G11C 8/18; G06F 9/321; G06F 12/0246
USPC .......................... 711/103, 104, 105, 155, 218
See application file for complete search history.

(56) References Cited

U.S. PATENT DOCUMENTS

| 2005/0071570 | A1* | 3/2005 | Takasugl et al. ............. 711/137 |
| 2011/0072201 | A1* | 3/2011 | Lee et al. ........................ 711/103 |
| 2013/0056260 | A1* | 3/2013 | Heisler et al. ................. 174/520 |
| 2014/0281770 | A1* | 9/2014 | Kim et al. ...................... 714/721 |

OTHER PUBLICATIONS

Adesto technologies, 4-megabit 2.3-volt or 2.7-volt Minimum SPI Serial Flash Memory, AT25DF041A, 3668F-DFLASH-11/2013, Data Sheet, Nov. 2013, 42 pages.
Gupta, Anil, "New Architecture for Code-Shadowing Applications, Dual-buffer SPI-NAND Arch providing SPI-NOR compatibility," Flash Memory Summit Presentation materials, Aug. 13, 2013, 14 pages.
Silicon Storage Technology, Inc., 16 Mbit SPI Serial Flash, SST25VF016B, Data Sheet, Jan. 2011, 31 pages.

* cited by examiner

*Primary Examiner* — Than Nguyen
(74) *Attorney, Agent, or Firm* — Haynes Beffel & Wolfeld LLP

(57) ABSTRACT

The present technology is directed to a method for accessing a memory device in response to read requests is described. The method comprises, in response to a first request, composing a first read sequence using a command protocol of the memory device. The first read sequence includes a command code and a starting physical address. Upon receipt of a second request, the method determines a starting physical address of a second read sequence according to the command protocol of the memory device. If the starting physical address of the second read sequence is sequential to an ending physical address of the first read sequence, then the method composes the second read sequence using the command protocol without a command code, else the method composes the second read sequence using the command protocol with a read command.

30 Claims, 8 Drawing Sheets

METHOD AND APPARATUS FOR IMPROVING SEQUENTIAL MEMORY READ PREFORMANCE

TECHNICAL FIELD

This disclosure relates to memory devices and memory controllers.

DESCRIPTION OF RELATED ART

Flash memory is a class of nonvolatile integrated circuit memory technology. Flash memory can have a parallel interface or a serial interface. Flash memory with a serial interface (or serial flash memory) requires fewer pin connections on a printed circuit board (PCB) than flash memory with a parallel interface, and can reduce overall system cost.

A host system incorporating a flash memory can read data from the flash memory by providing a read command including an address to the flash memory. The flash memory decodes the command and sends back data requested by the host system. Read performance of a flash memory is limited by the speed of its interface. Read performance of a serial flash memory can be further limited because read commands and data are transmitted to or from the serial flash memory through its serial interface, which can be slower than a parallel interface at the same clock rate.

It is therefore desirable to provide a method for improving read performance of a flash memory.

SUMMARY

A method for accessing a memory device in response to read requests is described. The method comprises, in response to a first request, composing a first read sequence using a command protocol of the memory device. The first read sequence includes a command code and a starting physical address. Upon receipt of a second request, the method determines a starting physical address of a second read sequence according to the command protocol of the memory device. If the starting physical address of the second read sequence is sequential to an ending physical address of the first read sequence, then the method composes the second read sequence using the command protocol without a command code, else the method composes the second read sequence using the command protocol with a read command.

Other aspects and advantages of the present technology can be seen on review of the drawings, the detailed description and the claims, which follow.

DETAILED DESCRIPTION

A detailed description of embodiments of the present technology is provided with reference to the Figures.

Figure 1:
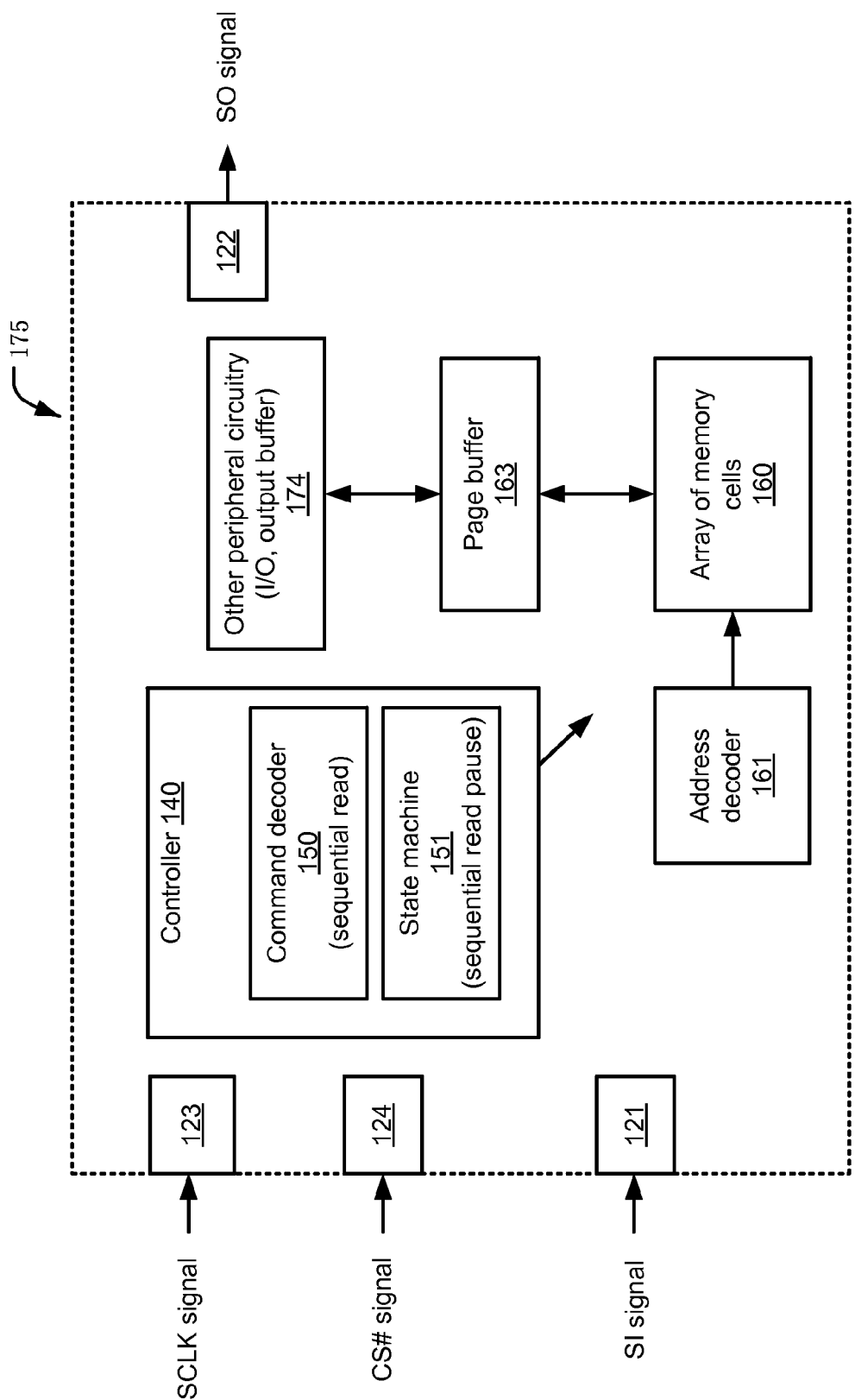
FIG. 1 is a simplified block diagram of a memory.

FIG. 1 is a simplified block diagram of a memory 175 that includes logic which executes a sequential read operation in response to a first read command, including logic by which a sequential read state can be paused or suspended. For example, the logic can pause the sequential read operation, and hold a sequential read state during the pause. The logic can later restart the sequential read operation without a second read command, thereby reducing the overhead on the channel that carries commands to the memory 175. In this example, the memory 175 includes a serial interface through which the read commands, addresses and data are communicated. The serial interface can be based on a Serial Peripheral Interface (SPI) bus in which the command channel shares the I/O pins used by address and data. For example, the memory 175 includes input/output ports or pins 121, 122, 123, and 124 for receiving and transmitting SPI bus signals. Pin 121 is connected to an input data line carrying serial input data/ address signal SI. Pin 122 is connected to an output data line carrying serial output data signal SO. Pin 123 is connected to a clock line carrying serial clock signal SCLK. Pin 124 is connected to a control line carrying chip enable or chip select signal CS#. The serial clock signal SCLK and chip enable signal CS# are input signals to the memory 175.

The memory 175 includes an array 160 of memory cells. The array 160 can have a NOR architecture, a NAND architecture or other architectures.

An address decoder 161 is coupled to the array 160. Addresses are supplied to the memory 175 on the pin 121 with the input signal SI and provided to the address decoder 161. The address decoder 161 can include word line decoders, bit line decoders, and other suitable decoders that decode the supplied addresses and select corresponding memory cells in the array 160.

Bit lines in the array 160 are coupled to a page buffer 163 in this example, which in turn is coupled to other peripheral circuitry 174. The page buffer 163 can include one or more storage elements for each bit line connected. The address decoder 161 can select and couple specific memory cells in the array 160 via respective connecting bit lines to the page buffer 163. The page buffer 163 can then store data that is written to or read from these specific memory cells.

Peripheral circuitry includes circuits that are formed using logic circuits or analog circuits that are not part of the array 160, such as the address decoder 161, the controller 140, and so on. In this example, the block 174 labeled other peripheral circuitry can include input-output (I/O) circuits, output data buffers, and other circuit components on the memory 175, such as a general purpose processor or special-purpose application circuitry, or a combination of modules providing system-on-a-chip functionality supported by the array 160.

The controller 140 provides signals to control other circuits of the memory 175 to carry out the various operations described herein. The controller 140 includes a command decoder 150 including logic supporting sequential read commands received on the serial port, and a state machine 151 or other sequential logic circuits, including logic supporting a paused sequential read state. The controller can be implemented using special-purpose logic circuitry as known in the art. In other embodiments, the controller comprises a general purpose processor, which may be implemented on the same memory 175, which executes a computer program to control the operations of the device. In yet other embodiments, a combination of special purpose logic circuitry and a general purpose processor may be utilized for implementation of the controller.

A command code is supplied to the memory 175 on pin 121 according to the SPI protocol with the input signal SI and provided to the command decoder 150. The command decoder 150 decodes the received command code. The command decoder 150 can also set a state for the memory 175 in the state machine 151 based on the decoded command. Based on the state in the state machine 151, the controller 140 provides signals to address decoders 161, page buffer 163, the other peripheral circuitry 174, or other circuits in the memory 175 to carry out one or more operations corresponding to the state stored in the state machine 151.

The data stored in the array 160 can be addressed in blocks of bytes or in other suitable block sizes such as blocks of 4 bytes, or blocks of 8 bytes, and so on. Each block can have an address in the array 160. A block of data can be read from the memory 175 by providing the memory 175 a read request including an address for the block of data.

The memory 175 supports a sequential read state. While in a sequential read state, the memory 175 automatically outputs blocks of data that have sequential addresses in the array 160 as long as the SCLK remains active. For example, after a first byte of data (e.g., at an address "03FFF2" in hexadecimal) is outputted from the output pin 122, the memory 175 automatically outputs a second byte of data at an address "03FFF3" that is sequential to the address of the first byte. The memory continues to output bytes of data at addresses that are sequential to the addresses of previously outputted bytes (e.g., "03FFF5", "03FFF6", "03FFF7", and so on) until the SCLK stops, or until the state changes out of the sequential read state, which can occur for example when the chip enable signal CS# is changed, as is described in more detail below.

Figure 2:
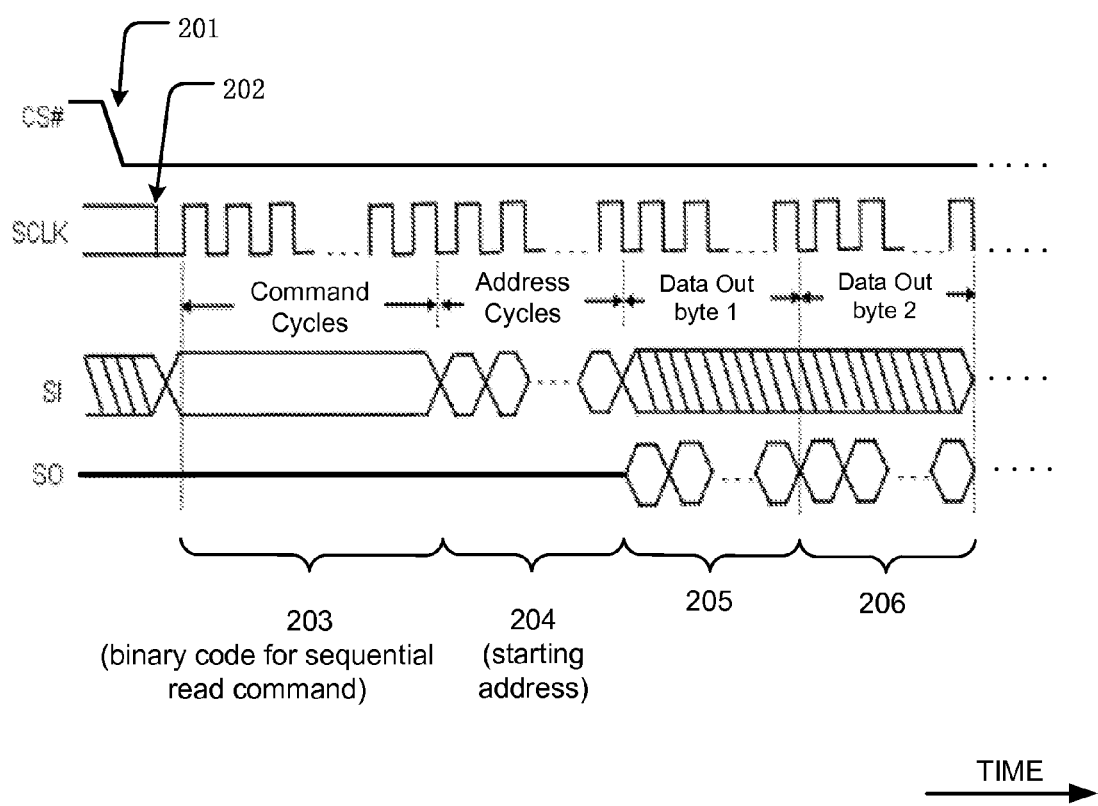
FIG. 2 is a timing diagram illustrating a command protocol of a memory.

The memory 175 receives and processes input data and outputs data in accordance with a command protocol of the memory 175. FIG. 2 is a timing diagram illustrating a command protocol of the memory 175. In this example, at instance 201, the chip enable signal CS# is changed from high to low. When the chip enable signal CS# is held low, the memory 175 is in an active mode and is available for receiving and processing input signals. A serial clock SCLK signal is provided to the memory 175 via the pin 123 (at instance 202). The memory 175 inputs or outputs data by latching input/output data bits to the serial clock SCLK.

As illustrated in the example shown in FIG. 2, during command cycles 203 following the instances 201 and 202, a command code of a byte or a sequence of bytes (e.g., a binary code "00000011" for a sequential read command) is provided to the memory 175 on the input data line connected to the pin 121. Each bit of the command code is latched on a rising edge of the serial clock SCLK signal (e.g., the command cycles 203 have 8 clock cycles for the binary code "00000011").

In this example, the command decoder 150 decodes the received command code (e.g., the binary code "00000011") and determines that it is a sequential read command. After determining the sequential read command, the command decoder 150 sets a sequential read state in the state machine 151. Meanwhile, the command decoder 150 (or other modules of the controller 140) decodes the subsequent byte or bytes received via the input data line connected to the pin 121 during the address cycles 204 as a starting address for the data stored in the array 160 requested by the sequential read command. For example, a 3-byte address (e.g., "03FFF2" in hexadecimal) can be provided to the memory 175 via the input data line connected to the pin 121 during the address cycles 204. Each bit of the 3-byte address is latched on a rising edge of the serial clock SCLK signal (i.e., the address cycles 204 have 24 clock cycles for the 3-byte address).

In the sequential read state, the memory 175 can output data sequentially, starting with a first block of data at the starting address of the sequential read command. For example, the controller 140 can provide the starting address and an output block size (e.g., a byte) to the address decoder 161. The address decoder 161 selects the memory cells in the array 160 that correspond to the byte at the starting address, and couples the selected memory cells to the page buffer 163. The controller 140 also sends control signals to the page buffer 163 and the other peripheral circuitry 174 to send the first byte of data stored in the selected memory cells to the output pin 122. Each bit of the first byte of data is latched on a falling edge of the serial clock SCLK and shifted out to the output data line connected to the output pin 122. In this example, the first byte of data ("Data Out byte 1" shown in FIG. 2) at the starting address (e.g., "03FFF2" in hexadecimal) of the sequential read command is outputted in 8 clock cycles during the time period 205 illustrated in FIG. 2.

In the sequential read state, the memory 175 continues outputting data sequentially after the first byte of data, if the serial clock SCLK is running and the chip enable signal CS# is held low, without requiring additional command and address data at the input pin 121. For example, after the first byte of data (at the address "03FFF2" in hexadecimal) is outputted, the second byte of data at an address (e.g., "03FFF3" in hexadecimal) sequential to the address of the first byte of data is outputted to the output pin 122. Each bit of the second byte of data is latched on a falling edge of the serial clock SCLK and shifted out to the output data line connected to the pin 122. Here, the second byte of data ("Data Out byte 2" shown in FIG. 2) is outputted in 8 clock cycles during the time period 206 illustrated in FIG. 2.

The sequential read state can be terminated by changing the chip enable signal CS# from low to high. When the chip enable signal CS# is held high, the memory 175 is in an inactive mode and stops outputting data. The memory 175 changes state the state machine 151 out of the sequential read state after the chip enable signal CS# is changed from low to high.

The sequential data output illustrated by FIG. 2 can be suspended by stopping the serial clock SCLK, while holding the chip enable signal CS# low. In this way, the sequential read state is pause or preserved in the state machine 151 and the sequential data output is suspended. The sequential data output can be resumed by resuming the serial clock SCLK.

Figure 3:
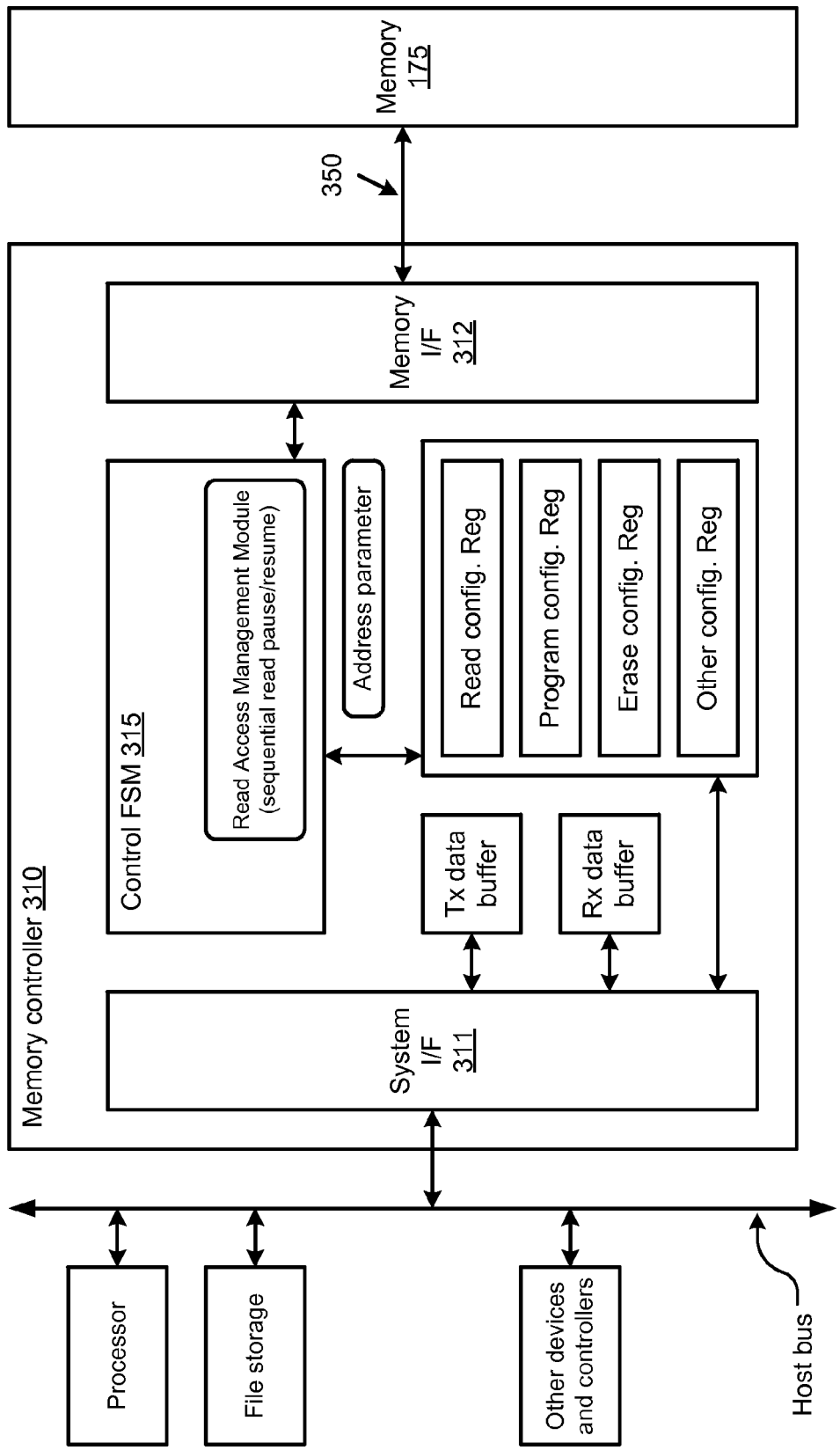
FIG. 3 is a block diagram of a memory controller communicating with a memory.

The memory 175 can receive a command code for a sequential read command and a starting address described above from a memory controller in communication with the memory 175. FIG. 3 is a block diagram of a memory controller 310 communicating with a memory, such as the memory 175 illustrated in FIG. 1. In this example, the memory controller 310 communicates with the memory 175 via an SPI Bus interface 350. The memory controller 310 includes a memory interface (I/F) 312 that controls the SPI bus signals (SI input signal, SO output signal, SCLK clock, CS# signal) to and from the memory 175.

The memory controller 310 and the memory 175 can be part of a computer system. The memory controller 310 includes a system interface (I/F) 311 that communicates via a host bus with other components of the computer system 300 such as a processor subsystem executing software programs, a file storage subsystem storing user data, and other devices and controllers (e.g., input/output devices, network interface devices, bus controllers). The system interface 311 stores incoming and outgoing data in a receiving (Rx) data buffer and a transmitting (Tx) data buffer.

A controller comprising a control finite state machine (FSM) 315 in this example, interacts with other circuitry of the memory controller 310 to carry out various operations, including read, program, and erase operations on the memory 175. In this example, information for various operations is stored in configuration registers such as read, program, and erase configuration registers. The control finite state machine 315 carries out an operation (e.g., a read operation) on the memory 175 by accessing information stored in a configuration register (e.g., the read configuration register) and causing the memory interface 312 to transmit to and receive from the memory 175 command codes and data via the SPI Bus interface 350. The controller can be implemented using other types of logic, including special-purpose logic circuitry as known in the art. In other embodiments, the controller comprises a general purpose processor which executes a computer program to control the operations on the memory 175. In yet another embodiment, a combination of special purpose logic circuitry and a general purpose processor may be utilized for implementation of the controller.

Higher level applications running on processors of a computer system incorporating the memory 175, such as an software application or a file system such as a disk file system (e.g., File Allocation Table or FAT file system) or a native flash file system (e.g., Journaling Flash File System Version 2 or JFFS2), or a flash translation layer, can make read requests for data stored in the memory 175. For example, a file system can translate the logical address of a read request (from a software application) to a physical address in the memory 175, and provide the physical address and the size of the data requested to the memory controller 310 (e.g., via the host bus). The control finite state machine 315 determines a starting physical address of the read request as, for example, the physical address received from the file system. In another example, the file system can provide the logical address of the read request and the size of the data requested to the memory controller 310. The control finite state machine 315 determines a starting physical address of the read request by translating the logical address received from the file system to the starting physical address. The control finite state machine 315 also computes an ending physical address for the read request. For example, data stored in the array 160 of the memory 175 are stored in bytes that are addressed by 3-byte addresses as described earlier. If the starting physical address (of the first byte of the read request) is "10AB05" in hexadecimal while the size of the data requested is 8 bytes, then the ending physical address (of the last byte of the read request) is "10AB0D" in hexadecimal.

The control finite state machine 315 then causes the memory interface 312 to first set the chip enable signal CS# low. If the CS# signal is already held low (e.g., the memory 175 is active for a previous operation), the memory interface 312 can first set the CS# signal high and then set the CS# signal low. That is, the memory controller 310 (with the memory interface 312) can end a previous operation of the memory 175 and reset the memory 175 by applying a pulse on the CS# control signal line. The memory interface 312 also starts the serial clock SCLK coupled to the memory 175. The memory interface 312 also provides a command code (for a sequential read command) and the starting physical address to the memory 175 via the SI input signals. The memory 175 decodes the command code and the starting physical address, and starts a sequential read operation. The memory 175 outputs data sequentially starting at the starting physical address as described earlier. The memory interface 312 (e.g., as instructed by the control finite state machine 315) can stop the sequential read operation by for example changing the CS# signal from low to high, which can occur after all the bytes stored in the array 160 between the starting physical address and the ending physical address are outputted by the memory 175, or upon some sorts of interruptions of the processing flow. The outputted bytes (i.e., the requested data) can be processed by the control finite state machine 315, and passed back (via the system interface 311 and the host bus) to the file system running on the processor subsystem.

As illustrated in FIG. 2, a sequential read operation for a read request for data stored in the memory 175 requires an overhead of 32 clock cycles for the command code and the starting physical address of the read request, regardless of whether the size of data requested is one byte (8 clock cycles) or 1 kilobyte (8,192 clock cycles). Thus, the average read performance (e.g., bytes per clock cycle) can be lower for a read request with a small requested data size (e.g., one or a few bytes), or for a group of read requests in which each request has a small requested data size.

However, if data requested by two or more read requests are stored sequentially in the memory 175, the data for these read requests can be read from the memory 175 sequentially with one read command and one starting physical address. For example, a sequential read operation for a first read request can be started by providing the memory 175 a read command and a starting physical address for the first read request. After data for the first read request is read from the memory 175, the sequential read operation can be paused by, for example, stopping the serial clock SCLK to the memory 175 and holding the CS# signal low. If a second read request following the first read request has a starting physical address that is sequential to the ending physical address of the first request, data for the second read request can be read from the memory 175 by resuming the sequential read operation by, for example, turning on the serial clock SCLK to the memory 175 again, without providing another read command and the starting physical address of the second read request. Data can be continuously read from the memory 175 by pausing and resuming the same sequential read operation as long as data requested by a next read request is sequential to the data of its previous read request. The clock cycles for the read command and starting physical address (of the first read request) are "shared" among these read requests, thus improving the average read performance (e.g., bytes per clock cycle) for each of these read requests.

Figure 4:
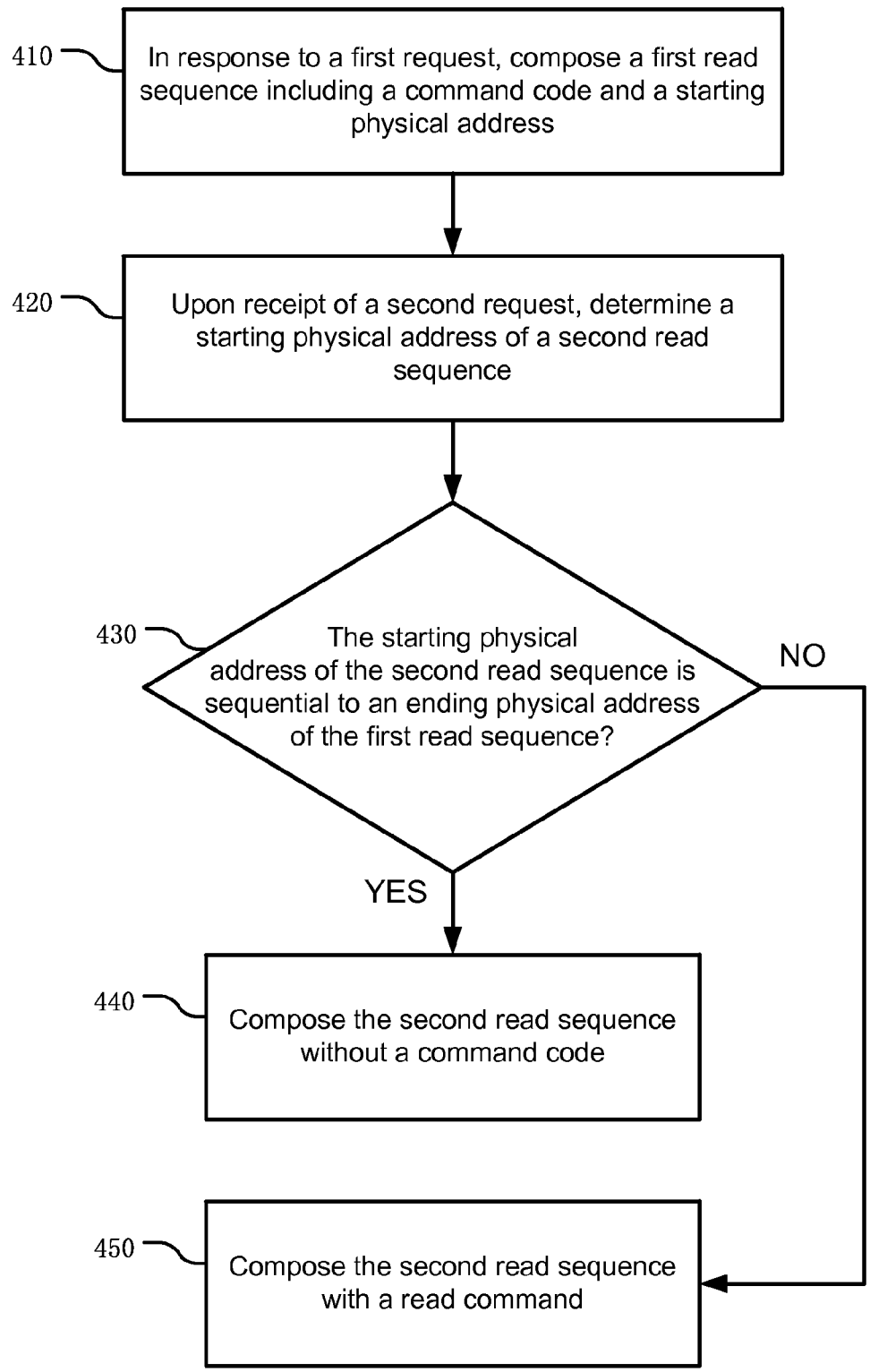
FIG. 4 is a flow chart of a method for producing a command sequence for a memory device in response to read requests.

FIG. 4 is a flow chart of a method for producing a command sequence for a memory device in response to read requests. The method can be implemented by control logic controlling the memory device. In this example, the method can be implemented with a read access management module of the memory controller 310 illustrated in FIG. 3. The read access management module includes a sequential read pause/resume function that performs pausing and resuming a sequential read operation for multiple read requests described herein. Such implementation of the method for accessing a memory device can be transparent to higher level applications running on a computer system accessing the memory device. Alternatively, the method can be implemented with software as part of a file system running on a computer system accessing the memory device.

The method of accessing a memory device in response to read requests illustrated by the flow chart of FIG. 4 starts at Step 410. At Step 410, in response to a first request for data stored in the memory device, the method composes a first read sequence using a command protocol of the memory device. The first read sequence includes a command code and a starting physical address.

For example, the read access management module receives a first read request from a host (e.g., a processor and an application running on the processor) of a system accessing data stored in the memory 175. The first read request can include for example a starting physical address for data stored in the memory 175 and a size of the requested data. Based on the first read request, the read access management module composes a first read sequence using a command protocol of the memory device. For example, the first read sequence can include a command code (e.g., the binary code "00000011" for a sequential read command described earlier) and the starting physical address (e.g., "03FFF2" in hexadecimal, where the physical address means the address as provided with the read request directly to the memory device).

The read access management module can also calculate an ending physical address for the first read request. Alternatively, the host can directly pass the starting and ending physical addresses to the read access management module.

The read access management module then causes the memory interface 312 to transmit the command code and the starting physical address of the first read sequence to the memory 175 via the SPI Bus interface 350. The memory 175 decodes the command code and the starting physical address, sets a sequential read state in the memory 175 (e.g., in state machine 151), and performs a corresponding sequential read operation to sequentially output data stored in the memory 175, starting at the starting physical address. For the first read request, the read access management module (via the memory interface 312) receives data sequentially outputted by the memory 175, starting at the starting physical address of the first read sequence. The read access management module passes the received data to the host (via the system interface 311 and the host bus), until data at the ending physical address of the first read sequence is received and passed to the host.

The first read sequence ends with a pause in the sequential read operation. The sequential read operation can be paused by stopping the serial clock SCLK to the memory 175 and holding the CS# signal low (or by another suitable signaling protocol), thus stopping sequential data output by the memory 175. The read access management module for example, can then store a parameter that indicates that the memory device remains in a paused sequential read state, along with information sufficient to identify the ending physical address of the pause sequential read operation.

At Step 420, upon receipt of a second read request, the method determines a starting physical address of a second read sequence according to the command protocol of the memory device. At Step 430, the method determines whether the starting physical address of the second read sequence is sequential to the ending physical address of the first read sequence. If the starting physical address of the second read sequence is sequential to the ending physical address of the first read sequence, and the memory device remains in the sequential read state of the first read sequence, the method composes the second read sequence using the command protocol without a command code and without a starting physical address (Step 440), by for example restarting the SCLK. The SCLK input is separate from the address and data lines used for the read command and read data sequences. This enables use of the SCLK as a signaling protocol to pause and restart sequential reads. Other signaling protocols can be utilized as well, preferably using signaling paths that are separate from the paths used for command, address and data flow.

Otherwise, if the starting physical address of the current read request is not sequential to the ending physical address of the previous sequential read, the method composes the second read sequence using the command protocol with a read command including a command code and starting physical address (Step 450).

For example, the read access management module receives from the host (e.g., a processor of the system accessing the memory 175 and another application running on the processor) a second read request and determines a starting physical address of a second read sequence. The read access management module also calculates an ending physical address for the second read sequence.

The read access management module then compares the starting physical address of the second read sequence and the ending physical address of the first read sequence. If the starting physical address of the second read request is sequential to the ending physical address of the first read sequence, then the read access management module composes the second read sequence using the command protocol without a command code and without a starting physical address, for example with restarting the serial clock SCLK. The read access management module then, based on the second read sequence without a command code, causes the memory interface 312 to restart the serial clock SCLK, causing the memory 175 to continue the sequential read operation that started for the first read sequence. For the second read request, the read access management module (via the memory interface 312) receives data sequentially outputted by the memory 175, starting at the starting physical address of the second read sequence. The read access management module passes the received data to the host, until data at the ending physical address of the second read sequence is received and passed to the host.

If the starting physical address of the second read sequence is not sequential to the ending physical address of the first read sequence or the memory device is not in a paused sequential read state, then the read access management module composes the second read sequence with the command protocol, with a read command (of a sequential read command). The second read sequence also includes the starting physical address of the second read request. The read access management module then causes the memory interface 312 to transmit the command code and the starting physical address to the memory 175 via the SPI Bus interface 350. The memory 175 decodes the command code, sets a new sequential read state, and starts a corresponding sequential read operation and outputs data sequentially from the starting physical address of the second read request. The read access management module (via the memory interface 312) receives data outputted by the memory 175 between the starting and ending physical addresses for the second read request, and passes the received data to the host for the second read request.

The second read sequence, with or without a command code, is described in more detail below in reference to FIG. 5.

Figure 5:
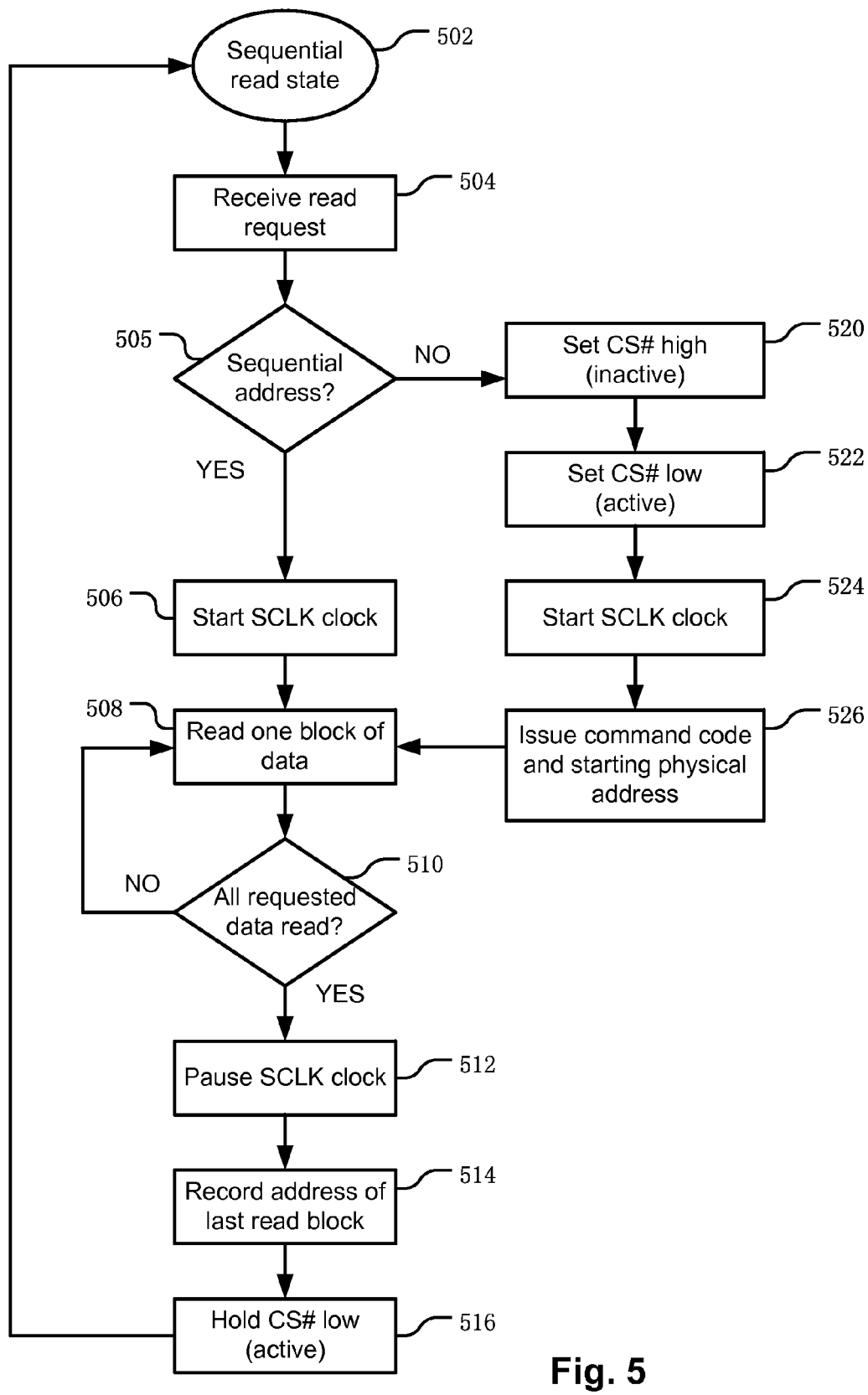
FIG. 5 is a flow chart of a method for accessing a memory device in response to read requests.

FIG. 5 is a flow chart of a method for accessing a memory device (e.g., the memory 175) in response to read requests. The method of FIG. 5 can be implemented by the read access management module and other components of the memory controller 310 illustrated in FIG. 3. The method of FIG. 5 also utilizes an address parameter that stores for example the address of the last block of data read from the memory 175 in the current sequential read state. The address parameter can be used to identify a starting position of a data output sequence from the memory 175. The address parameter can be stored in a physical register accessible to the read access management module.

The method of FIG. 5 starts at Step 502. At Step 502, the memory 175 is set in a sequential read state. For example, the memory 175 can be set in a sequential read state while the memory 175 is powered up. This can be a default state for environments in which a starting physical address is known that has a likelihood of being read as a first operation on power up, or reset, of the system, such as described with reference to FIG. 6 below.

In FIG. 5, at Step 504, the read access management module receives a read request from a host (e.g., a processor and an application running on the processor) of the system accessing the memory 175. The read request includes a starting physical address and a size of data requested. The read access management module can calculate an ending physical address of the read request based on the starting physical address and the size of data requested.

At Step 505, the read access management module determines whether the starting physical address of the read request is sequential to the physical address of the last block of data read from the memory 175 in the current sequential read state. The read access management module can read address parameter stored for the ending physical address of the last block of data read from the memory 175, and compare it with the starting physical address of the read request.

If the starting physical address of the read request is sequential to the physical address of the last block of data read from the memory 175 in the current sequential read state, at Step 506, the read access management module causes the memory interface 312 to resume the serial clock SCLK to the memory 175. As described earlier, the memory 175 resumes outputting data sequentially in the current sequential read state after the serial clock SCLK is resumed.

As described with FIG. 4, if the starting physical address of the read request is sequential to the physical address of the last block of data from the memory 175 in the current sequential read state (i.e., sequential to the ending physical address of the previous read request), the read sequence in response to the read request does not include a command code or an address for a new sequential read command (Step 440). The read sequence only includes resuming the serial clock SCLK to the memory 175 (Step 506), such that the memory 175 resume outputting data sequentially in the current sequential read state, starting from the starting physical address of the read request.

In FIG. 5, the read access management module (via the memory interface 312) reads one block of data (Step 508), and determines whether all requested data has been read from the memory 175 (Step 510). The read access management module starts reading the block at the starting physical address of the read request from the memory 175 and determines that all requested data has been read from the memory 175 when the block of data just read from the memory 175 has an address of the ending physical address of the read request.

If all requested data have been read from the memory 175, at Step 512, the read access management module causes the memory interface 312 to turn off the serial clock SCLK. At Step 514, the read access management module records the address of the last block of data read from the memory 175 in the address parameter. At Step 516, the memory interface 312 holds the chip enable signal CS# low. By turning off the serial clock SLCK and holding the chip enable signal CS# low, the current sequential read state is paused but maintained in the memory 175 while the memory 175 remains active for receiving further input, as indicated by the loop-back from Step 516 to Step 502 shown in FIG. 5.

If the starting physical address of the read request is not sequential to the physical address of the last block of data read from the memory 175 (as determined at Step 505), the read access management module can set the memory 175 to a new sequential read state. The read access management module causes the memory interface 312 to set the chip enable signal CS# high (Step 520). Setting the chip enable signal CS# high ends the current sequential read state stored in the state machine 151 and places the memory 175 in an inactive mode. At Step 522, the read access management module causes the memory interface 312 to set the chip enable signal CS# low, setting the memory 175 in an active mode ready for receiving and processing input signals.

At Step 524, the memory interface 312 resumes the serial clock SCLK to the memory 175 such that data can be transmitted to and from the memory 175. At Step 526, the memory interface 312 transmits a command code (for a sequential read command) and the starting physical address of the read request to the memory 175. As described earlier, the command decoder 150 decodes the command code and sets a new sequential read state in the state machine 151, causing the memory 175 to start output data sequentially from the starting physical address. The read access management module sequentially reads one block of data, starting at the starting physical address of the read request, until all data of the request are read from the memory 175 (as illustrated by the loop of Steps 508 and 510).

As described in FIG. 4, if the starting physical address of the read request is not sequential to the physical address of the last block of data from the memory 175 in the current sequential read state (i.e., not sequential to the ending physical address of the previous read request), the read sequence in response to the read request includes a command code for a new sequential read command (Step 450). As illustrated in FIG. 5, the read sequence includes applying a pulse on the chip enable signal line (Steps 520 and 522), resuming the serial clock SCLK to the memory 175 (Step 524), and issuing a command code (for a new sequential read command) and a starting physical address (Step 526). The read sequence causes the memory 175 to output data sequentially in a new sequential read state, from the starting physical address of the read request.

Figure 6:
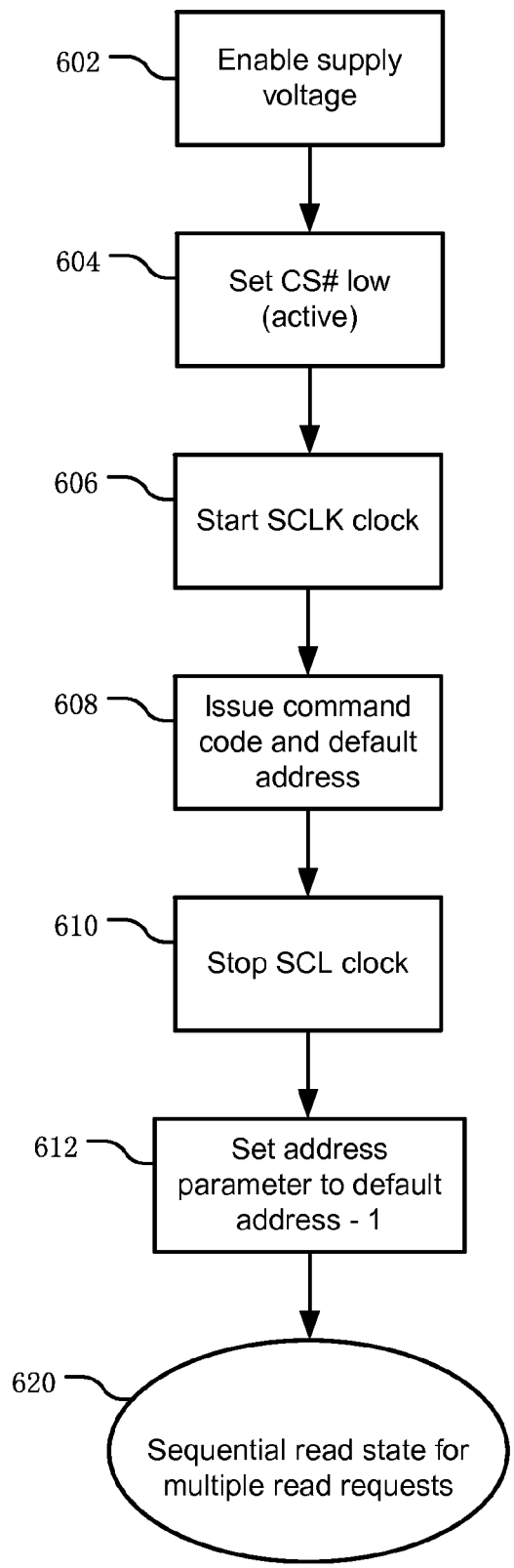
FIG. 6 is a flow chart for a power-up sequence of a memory.

FIG. 6 is a flow chart for an example power-up sequence of the memory 175. At Step 602, a supply voltage is provided to the memory 175 (e.g., by the system accessing the memory 175). At Step 604, the memory interface 312 (e.g., as instructed by the read access management module) sets the chip enable signal CS# for the memory 175 from high to low. As described earlier, the memory 175 is active and can receive and process input signals when the chip enable signal CS# is held low. At Step 606, the memory interface 312 turns on the serial clock SCLK input to the memory 175. At Step 608, the memory interface 312 transmits a command code and a default physical address (e.g., "000001" in hexadecimal) to the memory 175 (via the input data line connected to the pin 121). The command code includes a binary code for a sequential read command (e.g., "00000011" as described earlier). After the command code and the default address are transmitted, the memory interface 312 turns off the serial clock SCLK from the memory 175 (Step 610). At Step 612, the read access management module sets the address parameter to the address one block before the default address (e.g., "000000" in hexadecimal), indicating that the next block of data outputted from the memory 175 in an existing sequential read state will be the block of data stored at the default address in the array 160. Meanwhile, after receiving and decoding the command code, the command decoder 150 sets in the state machine 151 a sequential read state (Step 620). With a new sequential read state and a provided default starting physical address, the memory 175 is configured to output data sequentially, starting at the default address of the block of data stored in the array 160. Since the serial clock SCLK is off immediately after the command code and the default address are provided to the memory 175, there is no data outputted by the memory 175. The memory 175 can resume outputting data sequentially, starting from the default address of the block of data stored in the array 160, after the serial clock SCLK is turned on again.

In an alternative embodiment, a command code for a sequential read command is provided to the memory 175, without providing a physical address, before the serial clock SCLK is turned off. In this case, the command decoder 150 sets in the state machine 151 a sequential read state that is configured to output data sequentially, starting at a default address (e.g., "000001" in hexadecimal) in the array 160. The address parameter is set to a particular value (a flag), indicating that the next block of data outputted with the current sequential read state will be of the default address in the array 160, after the serial clock SCLK is turned on again.

Embodiments of the technology described herein can thus support a default ending physical address value for the driver logic, to be utilized upon start up events, like reset or power up.

Thus FIG. 6 is an example of method for accessing a memory device in response to read requests, in which the read access management module stores a parameter indicating a physical address (such as a default physical address) for the memory device. In this example, upon receipt of a read request, the read access management module determines a starting physical address of a read sequence according to the command protocol of the memory device, and if the starting physical address of the read sequence matches the stored parameter, then composing the read sequence using the command protocol without a command code, else composing the read sequence using the command protocol with a read command. The read access management module can, before receipt of said read request, sending a command to the memory device causing the memory device to enter a paused sequential read state. These steps can occur on power up or reset, causing the memory device to enter a paused sequential read state, and setting the parameter to indicate a default physical address. Also, the parameter can be determined from, or consist of, an ending physical address of a previous sequential read operation, as described above.

Figure 7:
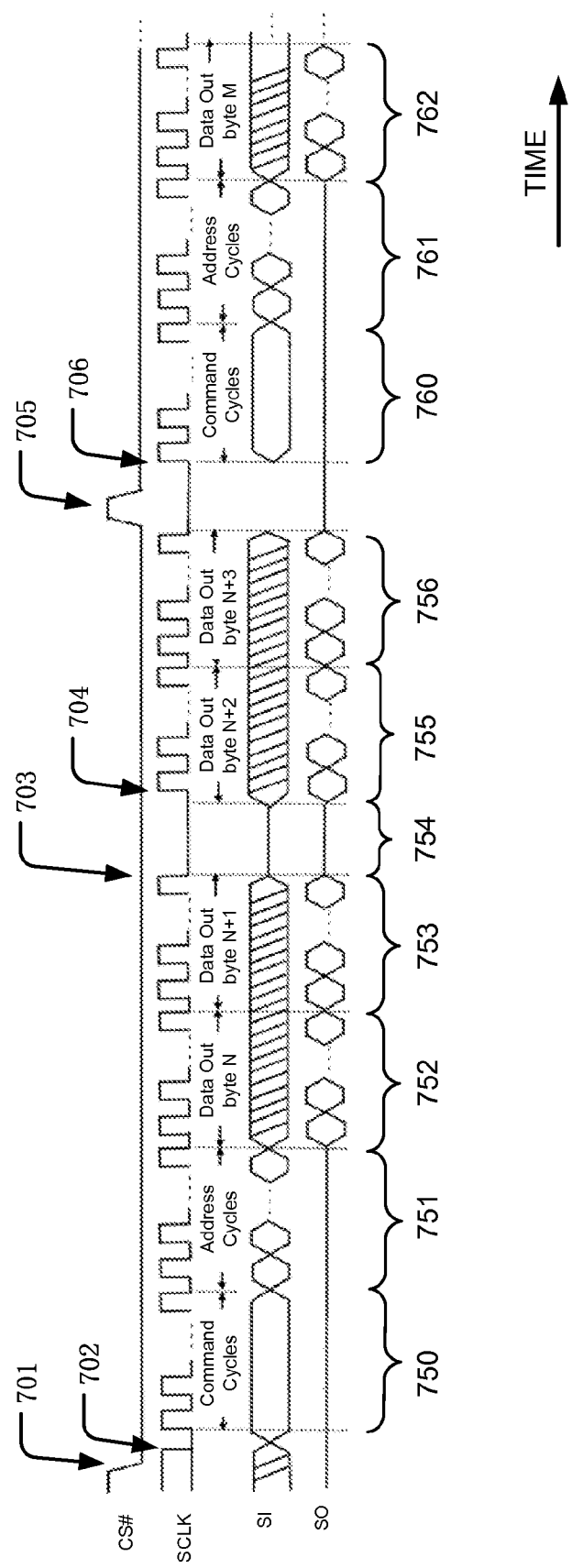
FIG. 7 is a timing diagram illustrating a method for accessing a memory device in response to read requests.

FIG. 7 is a timing diagram illustrating a method for accessing a memory device in response to read requests, such as the method illustrated by FIG. 5.

In this example, for a first read request, the chip enable signal CS# is set low (at instance 701), setting the memory 175 in an active mode. The serial clock SCLK is on (at instance 702). A command code (for a sequential read command) and a starting physical address are issued to the memory 175 during command cycles 750 and address cycles 751, respectively. As described earlier, based on the provided command code and starting physical address, the memory 175 is set to a sequential read state and starts output data sequentially (starting at the starting physical address), as illustrated by the time periods 752 and 753 shown in FIG. 7.

After data is outputted by the memory 175 for the first read request, as illustrated at the instance 703 in FIG. 7, the serial clock SCLK is stopped (Step 512), while the chip enable signal CS# is held low (Step 516). Thus the sequential data output by the memory 175 is suspended. The memory 175 stays in a paused sequential read state initiated by the first read request (time period 754).

For a second read request, if the starting physical address of the second read request is sequential to the ending physical address of the first read request, at an instance 704, the serial clock SCLK is resumed (Step 506). Thus the memory 175 resumes outputting data sequentially, starting from the starting physical address of the second read request, as illustrated by the time periods 755 and 756 shown in FIG. 7.

For a third read request, if the starting physical address of the third read request is not sequential to the ending physical address of the second read request, as illustrated by Steps 520 and 522 of FIG. 5, the chip enable signal CS# is set high then set low, as illustrated by the pulse 705. Also, at the end of the previous sequential read, the SCLK is stopped (just before pulse 705 in this example, though the time interval may be any amount). The pulse 705 in the chip enable signal CS# resets the command decoder 150 of the memory 175. At an instance 706, the serial clock SCLK is resumed. A command code for a new sequential read command and the starting physical address of the third read request are issued to the memory 175 during the time periods 760 and 761, respectively. As described with the Steps 520 through 526, the memory 175 is set to a new sequential read state and starts outputting data sequentially from the starting physical address of the third read request, as illustrated by the time period 762 in FIG. 7.

Figure 8:
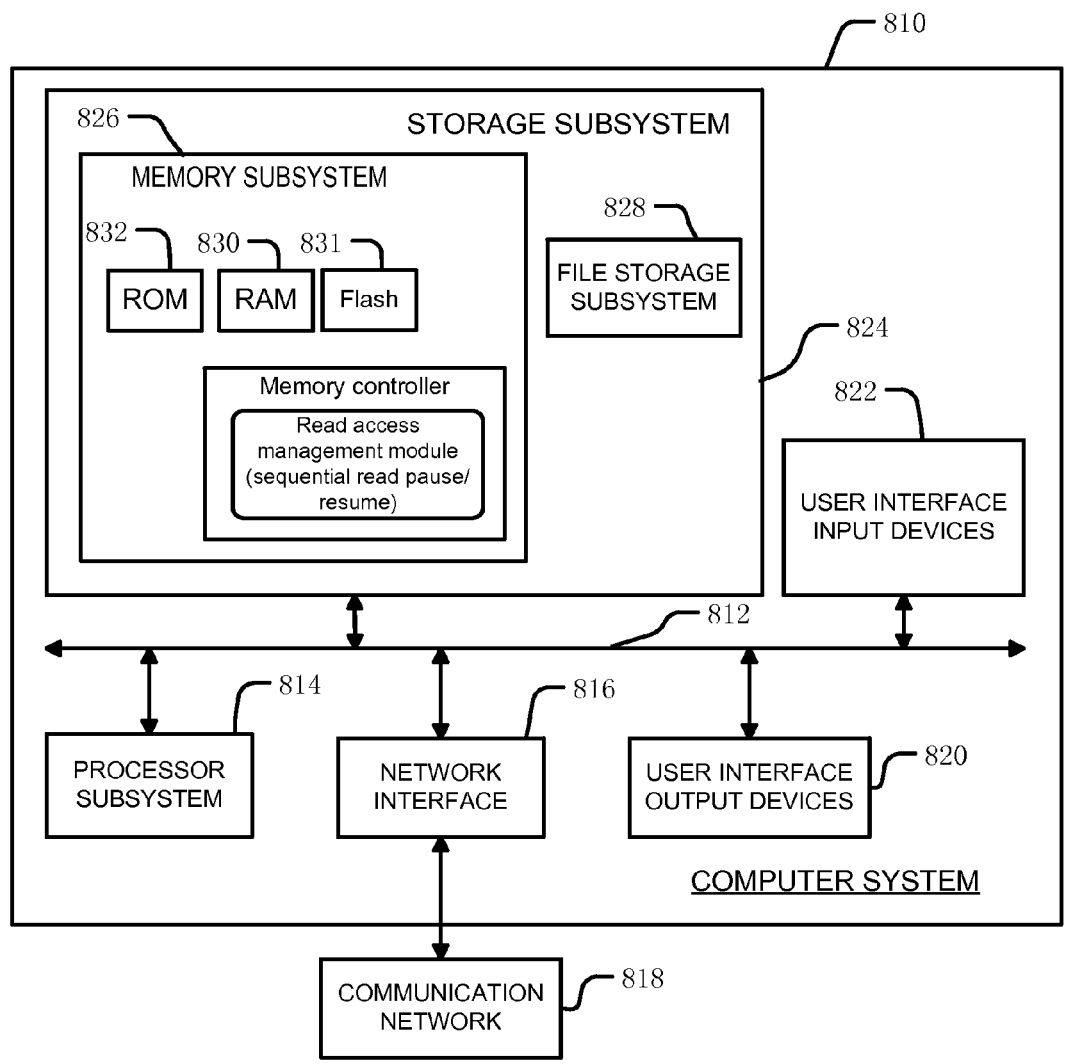
FIG. 8 is a block diagram of a computer system.

FIG. 8 is a block diagram of a computer system 810 that can include the memory controller and read access management module illustrated in FIG. 3.

Computer system 810 typically includes a processor subsystem 814 which communicates with a number of peripheral devices via bus subsystem 812. These peripheral devices may include a storage subsystem 824, comprising a memory subsystem 826 and a file storage subsystem 828, user interface input devices 822, user interface output devices 820, and a network interface subsystem 816. The input and output devices allow user interaction with computer system 810. Network interface subsystem 816 provides an interface to outside networks, including an interface to communication network 818, and is coupled via communication network 818 to corresponding interface devices in other computer systems. Communication network 818 may comprise many interconnected computer systems and communication links. These communication links may be wireline links, optical links, wireless links, or any other mechanisms for communication of information, but typically it is an IP-based communication network. While in one embodiment, communication network 818 is the Internet, in other embodiments, communication network 818 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 822 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 810 or onto communication network 818.

User interface output devices 820 may include a display subsystem, a printer, a fax machine, or non-visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 810 to the user or to another machine or computer system.

Storage subsystem 824 stores the basic programming and data constructs that provide the functionality of certain embodiments of the present invention. For example, the various modules implementing the functionality of certain embodiments of the invention may be stored in storage subsystem 824. For example, program codes for some or all of the logic used by the read access management module implementing the method for accessing a memory device described above, including the sequential read pause/resume function, can be stored in storage subsystem 824. These software modules can be generally executed by processor subsystem 814.

Memory subsystem 826 typically includes a number of memories including a main random access memory (RAM) 830 for storage of instructions and data during program execution and a read only memory (ROM) 832 in which fixed instructions are stored. Memory subsystem 826 can also include a flash memory 831 (e.g., the memory 175) which can be operated as described herein by a memory controller including the read access management module with sequential read pause/resume function. File storage subsystem 828 provides persistent storage for program and data files, and may include a hard disk drive, a floppy disk drive along with associated removable media, a CD ROM drive, an optical drive, or removable media cartridges. The modules implementing the functionality of certain embodiments of the invention may have been provided on a computer readable medium such as one or more CD-ROMs, and may be stored by file storage subsystem 828. The host memory subsystem 826 contains, among other things, computer instructions which, when executed by the processor subsystem 814, cause the computer system to operate or perform functions as described herein. As used herein, processes and software that are said to run in or on "the host" or "the computer," are executed on the processor subsystem 814 in response to computer instructions and data in the host memory subsystem 826, including any other local or remote storage for such instructions and data.

Bus subsystem 812 provides a mechanism for letting the various components and subsystems of computer system 810 communicate with each other as intended. Although bus subsystem 812 is shown schematically as a single bus, alternative embodiments of the bus subsystem may use multiple busses.

Computer system 810 itself can be of varying types including a personal computer, a portable computer, a workstation, a computer terminal, a network computer, a television, a mainframe, a server farm, or any other data processing system or user device. Due to the ever changing nature of computers and networks, the description of computer system 810 depicted in FIG. 8 is intended only as a specific example for purposes of illustrating the preferred embodiments of the present invention. Many other configurations of computer system 810 are possible having more or less components than the computer system depicted in FIG. 8.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A method for accessing a memory device in response to read requests, comprising:

in response to a first request, composing a first read sequence using a command protocol of the memory device, the first read sequence including a command code and a starting physical address; and upon receipt of a second request, determining a starting physical address of a second read sequence according to the command protocol of the memory device, and if the starting physical address of the second read sequence is sequential to an ending physical address of the first read sequence, then composing the second read sequence using the command protocol without a command code, else composing the second read sequence using the command protocol with a read command, wherein the memory device includes a state machine including a sequential read state, and the first read sequence ends with a pause in the sequential read state.

2. The method of claim 1, wherein the command code includes a byte or a sequence of bytes interpreted by a command decoder on the memory device.

3. The method of claim 1, wherein the first read sequence includes a pulse on a control line, and the command code includes a byte or a sequence of bytes on one or more data lines that follow the pulse.

4. The method of claim 3, wherein the control line is a chip enable control line.

5. The method of claim 1, wherein the first read sequence includes a pulse on a control line, and the command code includes a byte or a sequence of bytes interpreted by a command decoder on the memory device, and the memory device resets the command decoder in response to the pulse on the control line.

6. The method of claim 1, wherein the sequential read state is paused by a signal protocol on a line separate from a command or data line to the memory device.

7. The method of claim 1, wherein the sequential read state is paused by stopping a clock signal to the memory device.

8. The method of claim 7, wherein the sequential read state is resumed by resuming the clock signal to the memory device.

9. The method of claim 1, wherein the sequential read state is ended by a signal protocol on a chip enable control line to the memory device.

10. The method of claim 1, wherein if the starting physical address of the second read sequence is sequential to an ending physical address of the first read sequence, the second read sequence includes only resuming a clock to the memory device, causing the memory device to output data sequentially from the starting physical address of the second read sequence, when the memory device is in a sequential read state.

11. The method of claim 1, wherein if the starting physical address of the second read sequence is not sequential to an ending physical address of the first read sequence, the second sequence includes applying a pulse on a chip enable control line, starting a clock to the memory device, and issuing a command code including the starting physical address of the second read sequence, causing the memory device to output data sequentially form the starting physical address of the second read sequence.

12. The method of claim 1, further comprising translating an address in a read request to a physical address used with a read command to the memory device.

13. The method of claim 1, further comprising setting the sequential read state in the state machine of the memory device without a command code and without a starting physical address, and pausing the sequential read state by stopping a clock signal to the memory device.

14. An apparatus coupled to a memory device, the apparatus comprising:

logic configured to:
in response to a first read request, compose a first read sequence using a command protocol of the memory device, the first read sequence including a command code and a starting physical address; and
upon receipt of a second read request, determine a starting physical address of a second read sequence according to the command protocol of the memory device, and if the starting physical address of the second read sequence is sequential to an ending physical address of the first read sequence, then compose the second read sequence using the command protocol without a command code, else compose the second read sequence using the command protocol with a read command, wherein the memory device includes a state machine including a sequential read state, and the first read sequence ends with a pause in the sequential read state.

15. The apparatus of claim 14, wherein the command code includes a byte or a sequence of bytes interpreted by a command decoder on the memory device.

16. The apparatus of claim 14, wherein the first read sequence includes a pulse on a control line, and the command code includes a byte or a sequence of bytes on one or more data lines that follow the pulse.

17. The apparatus of claim 16, wherein the control line is a chip enable control line.

18. The apparatus of claim 14, wherein the first read sequence includes a pulse on a control line, and the command code includes a byte or a sequence of bytes interpreted by a command decoder on the memory device, and the memory device resets the command decoder in response to the pulse on the control line.

19. The apparatus of claim 14, wherein the sequential read state is paused by a signal protocol on a line separate from a command or data line to the memory device.

20. The apparatus of claim 14, wherein the sequential read state is paused by topping a clock signal to the memory device.

21. The apparatus of claim 20, wherein the sequential read state is resumed by resuming the clock signal to the memory device.

22. The apparatus of claim 14, wherein the sequential read state is ended by a signal protocol on a chip enable control line to the memory device.

23. The apparatus of claim 14, wherein if the starting physical address of the second read sequence is sequential to an ending physical address of the first read sequence, the second read sequence includes only resuming a clock to the memory device, causing the memory device to output data sequentially from the starting physical address of the second read sequence, when the memory device is in a sequential read state.

24. The apparatus of claim 14, wherein if the starting physical address of the second read sequence is not sequential to an ending physical address of the first read sequence, the second sequence includes applying a pulse on a chip enable control line, starting a clock to the memory device, and issuing a command code including the starting physical address of the second read sequence, causing the memory device to output data sequentially form the starting physical address of the second read sequence.

25. The apparatus of claim 14, wherein the logic is further configured to translate an address in a read request to an address used with a read command to the memory device.

26. The apparatus of claim 14, wherein the logic is further configured to set a sequential read state in a state machine of the memory without a command code and without a starting physical address, and pause the sequential read state by stopping a clock signal to the memory device.

27. A method for accessing a memory device in response to read requests, comprising:
storing a parameter indicating a physical address for the memory device; and
upon receipt of a read request, determining a starting physical address of a read sequence according to the command protocol of the memory device, and if the starting physical address of the read sequence matches the stored parameter, then composing the read sequence using the command protocol without a command code, else composing the read sequence using the command protocol with a read command, including before receipt of said read request, sending a command to the memory device causing the memory device to enter a paused sequential read state.

28. A method for accessing a memory device in response to read requests, comprising:
storing a parameter indicating a physical address for the memory device; and
upon receipt of a read request, determining a starting physical address of a read sequence according to the command protocol of the memory device, and if the starting physical address of the read sequence matches the stored parameter, then composing the read sequence using the command protocol without a command code, else composing the read sequence using the command protocol with a read command, including on power up or reset, causing the memory device to enter a paused sequential read state, and setting the parameter to indicate a default physical address.

29. An apparatus coupled to a memory device, the apparatus comprising:
logic configured to:
store a parameter indicating a physical address for the memory device; and
upon receipt of a read request, determine a starting physical address of a read sequence according to the command protocol of the memory device, and if the starting physical address of the read sequence matches the stored parameter, then compose the read sequence using the command protocol without a command code, else compose the read sequence using the command protocol with a read command, wherein the logic is configured to:
before receipt of said read request, send a command to the memory device causing the memory device to enter a paused sequential read state.

30. An apparatus coupled to a memory device, the apparatus comprising:
logic configured to:
store a parameter indicating a physical address for the memory device; and
upon receipt of a read request, determine a starting physical address of a read sequence according to the command protocol of the memory device, and if the starting physical address of the read sequence matches the stored parameter, then compose the read sequence using the command protocol without a command code, else compose the read sequence using the command protocol with a read command, wherein the logic is configured to:
on power up or reset, cause the memory device to enter a paused sequential read state, and set the parameter to indicate a default physical address.

* * * * *